United States Patent [19]
Park et al.

[11] Patent Number: 5,677,200
[45] Date of Patent: Oct. 14, 1997

[54] COLOR CHARGE-COUPLED DEVICE AND METHOD OF MANUFACTURING THE SAME

[75] Inventors: Chul Ho Park; Jin Seop Shim, both of Chungcheongbuk-do; Kwang Bok Song, Seoul, all of Rep. of Korea

[73] Assignee: LG Semicond Co., Ltd., Chungcheongbuk-do, Rep. of Korea

[21] Appl. No.: 442,879

[22] Filed: May 17, 1995

[51] Int. Cl.$^6$ .................. H01L 31/18; H01L 31/232; H01L 21/70; G02F 1/29
[52] U.S. Cl. .................. 437/3; 437/53; 257/432; 359/619
[58] Field of Search .................. 437/213, 53; 257/431, 257/432; 359/619

[56] References Cited

U.S. PATENT DOCUMENTS

| | | | |
|---|---|---|---|
| 5,321,297 | 6/1994 | Enomoto | 359/619 |
| 5,444,277 | 8/1995 | Nakai et al. | 257/223 |
| 5,466,612 | 11/1995 | Fuse et al. | 437/53 |
| 5,534,720 | 7/1996 | Song et al. | 257/432 |
| 5,605,783 | 2/1997 | Revelli et al. | 430/321 |

FOREIGN PATENT DOCUMENTS

| | | |
|---|---|---|
| 60-263458 | 12/1985 | Japan. |
| 64-7562 | 1/1989 | Japan. |

*Primary Examiner*—John Niebling
*Assistant Examiner*—Brian K. Dutton

[57] ABSTRACT

A method of manufacturing a color charge-coupled device is disclosed including the steps of alternately forming a plurality of light detectors corresponding to first to third colors and a plurality of charge transmission regions on a semiconductor substrate; forming a pad on one side of the substrate excluding a portion where the light detectors and charge transmission regions are formed; forming a planarizing film on the substrate excluding the pad; coating a microlens material on the planarizing film and patterning the microlens material so as to be left only on the planarizing film above the light detectors; thermally flowing the microlens material, to thereby form microlenses on the planarizing film above the light detectors; and hard-baking first to third dyeing layer, to thereby form first to third color filter layers on each microlens excluding the edge portion.

14 Claims, 6 Drawing Sheets

COLOR CHARGE-COUPLED DEVICE AND METHOD OF MANUFACTURING THE SAME

BACKGROUND OF THE INVENTION

The present invention relates to a color charge-coupled device, and more particularly, to a color charge-coupled device and a method of manufacturing the same, which is suited to improve sensitivity and to prevent color mixing.

FIGS. 1A to 1D are cross-sectional views for illustrating a method of manufacturing a conventional color charge-coupled device.

Referring to FIG. 1A, through a general process, a plurality of photodiodes 11 for generating a signal charge according to an intensity of light incident and a plurality of vertical charge-coupled devices (VCCDs) 12, i.e., charge transmission regions for transmitting the signal charge generated from photodiodes 11, are alternately formed on a substrate 10. A pad 13 is formed on one side of the substrate excluding a portion where the photodiodes and VCCDs are formed, thereby forming a black/white charge-coupled device.

Of photodiodes 11, reference numeral 11-1 represents a photodiode corresponding to a first color. Reference numeral 11-2 represents a photodiode corresponding to a second color. Reference numeral 11-3 represents a photodiode corresponding to a third color.

A first planarizing film 14 is formed on the entire surface of substrate 10 in which the charge-coupled device is formed.

Thereafter, a color filter layer 15 is formed on first planarizing film 14. Specifically, after forming a resin layer on first planarizing film 14, the resin layer is dyed and adhered with the first color. The colored resin layer is photo-etched, thereby forming a first color filter layer 15-1. By repeating the above process, second and third color filter layers 15-2 and 15-3 are formed on first planarizing film 14, respectively. As a result, the color filter layers of three colors are sequentially formed on first planarizing film 14, thereby completing a process of forming color filter layer 15.

After completing a process of forming color filter layer 15, a second planarizing film 16 is formed on first planarizing film 14 including color filter layer 15, thereby planarizing the substrate again.

Referring to FIG. 1B, as a material 17 for microlens, a photoresist film is coated on second planarizing film 16. By performing a photo-etching process, material 17 for microlens is patterned so as to be left only on each photodiode region 11.

Referring to FIG. 1C, patterned material 17 for microlens is thermally flowed, thereby forming convex microlenses 18 on second planarizing film 16 above each photodiode 11.

Referring to FIG. 1D, a photoresist film 19 is coated on second planarizing film 16 on which microlenses 18 are formed. Then, photoresist film 19 above pad 13 is removed through a photo-etching process, thereby exposing second planarizing film 16.

Exposed second planarizing film 16 and first planarizing film 14 placed thereunder are sequentially etched by using photoresist film 19 as a mask, thereby exposing pad 13.

Finally, after exposing pad 13, remaining photoresist film 19 is removed, thereby producing the conventional color charge coupled device.

In case that the color charge coupled device manufactured according to the above-discussed method is applied to a camera, light incident through a camera lens is converged by microlens 18, and the light converged by microlens 18 is selectively permeated through color filter layer 15. That is, among color filter layers 15, first color filter layer 15-1 selectively permeates light only for the first color, of light converged by the microlens, and applies it to photodiode 11-1 corresponding to the first, color among plurality of photodiodes 11. Second color filter layer 15-2 selectively permeates light only for the second color and applies it to photodiode 11-2 corresponding to the second color. Third color filter layer 15-3 selectively permeates light only for the third color and applies it to photodiode 11-3 corresponding to the third color.

Accordingly, light incident upon each photodiode 11 is transformed photoelectrically, thereby generating a signal charge. The charge generated from photodiode 11 is transmitted to VCCD 12 by the signal transmission operation of a general charge-coupled device, and then, transmitted to a horizontal charge-coupled device (HCCD) (not shown). After sensing the signal charge transmitted to the HCCD due to a floating diffusion from the tip of device, the signal charge is amplified through an amplifier (not shown) and then, transmitted to a peripheral circuit.

However, the method of manufacturing the conventional color coupled device involves the following problems.

First, in order to form the color filter layer according to the conventional method, a photo-etching process is performed three times. During the photo-etching process of forming the color filter layer, a photoresist film is left on an undesired portion, thereby causing color mixing. Further, light is permeated between neighboring color filter layers. This also causes color mixing.

Secondly, since the second planarizing film exists between the microlens and color filter layer, light is likely to be scattered. Further, due to the distance offset between the microlens and color filter layer, it is difficult to adjust a depth of focus to the photodiode.

Thirdly, the second planarizing film is formed after forming the color filter layer, complicating the whole process. This also consumes a great amount of a manufacturing time. The thickness of the device is increased as well.

SUMMARY OF THE INVENTION

In order to solve the aforementioned problems of the conventional method, it is an object of the present invention to provide a color charge-coupled device and a method of manufacturing the same, which is capable of not only adjusting a depth of focus easily but also preventing color mixing between neighboring color filter layers, by directly forming a color filter layer on a microlens.

It is another object of the present invention to provide a color charge-coupled device and a method of manufacturing the same, which is contrived to make a device slim by decreasing the overall thickness of the device.

It is still another object of the present invention to provide a color charge-coupled device and a method of manufacturing the same, in which a color filter layer is formed on a microlens so as to expose the edge portion of the microlens and white light is permeated through the periphery (edge portion) of the microlens, thereby improving an sensitivity.

To accomplish the object of the present invention, there is provided a color charge-coupled device comprising a semiconductor substrate; a plurality of charge transmission regions formed spaced apart by an equal distance on the semiconductor substrate; a plurality of light detectors corresponding to first to third colors and formed on the semiconductor substrate between the charge transmission regions so that the light detectors and charge transmission regions are arranged in alternate locations; a pad formed on one side of the semiconductor substrate excluding the light detectors and charge transmission regions; a planarizing film formed on the substrate excluding the pad; a plurality of microlenses formed on the planarizing film above each light detector; and first to third color filter layers corresponding to the first to third light detectors and formed directly on each microlens excluding the edge portion, respectively.

Further, there is provided a method of manufacturing a color charge-coupled device according to the present invention, comprising the steps of forming in alternate locations a plurality of light detectors corresponding to first to third colors and a plurality of charge transmission regions, on a semiconductor substrate; forming a pad on one side of the substrate excluding a portion where the light detectors and charge transmission regions are formed; forming a planarizing film on the substrate excluding an upper portion of the pad; coating a material for microlens on the planarizing film and patterning the material for microlens so as to be left only on the planarizing film above the light detectors; thermally flowing the material for microlens, to thereby form microlenses on the planarizing film above the light detectors; and performing a hard-baking process to thereby form first to third color filter layers directly on the microlenses corresponding to the light detectors of first to third colors.

BRIEF DESCRIPTION OF THE ATTACHED DRAWINGS

DETAILED DESCRIPTION OF THE INVENTION

Hereinafter, a color charge-coupled device according to preferred embodiments of the present invention will be described with reference to the attached drawings.

Figure 1A:
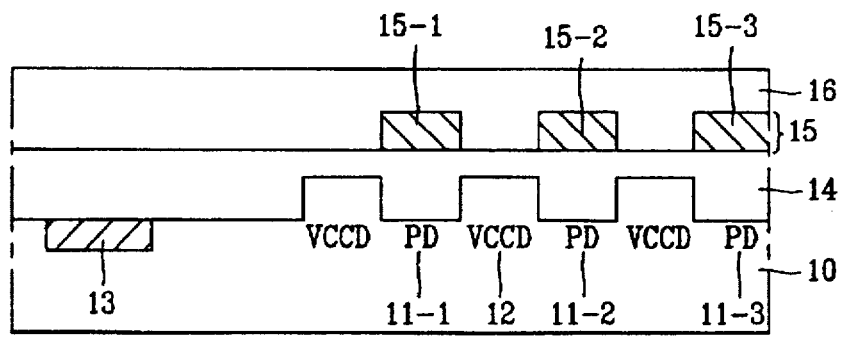
FIGS. 1A to 1D are cross-sectional views for illustrating a method of manufacturing a conventional color charge-coupled device.
Figure 1B:
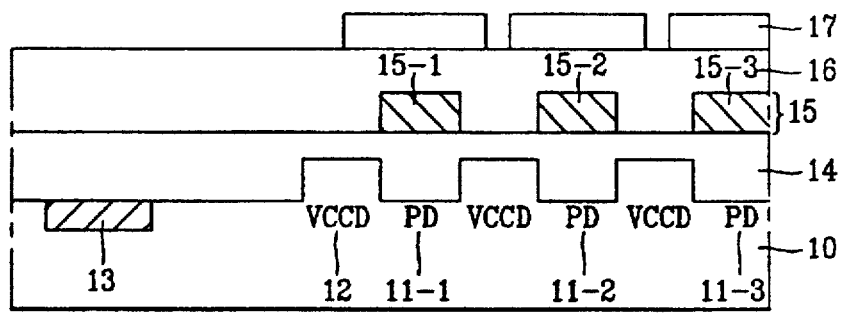
Figure 1C:
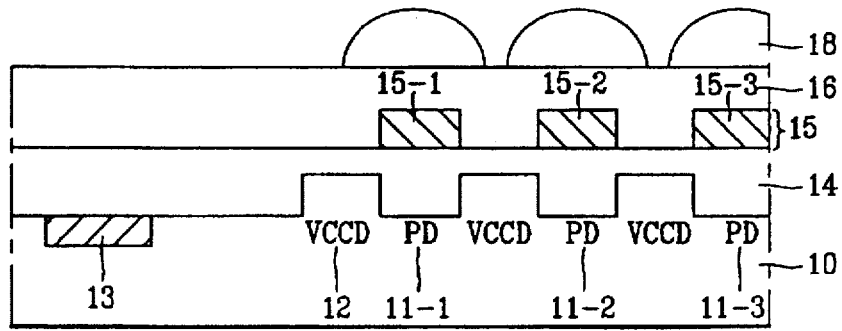
Figure 1D:
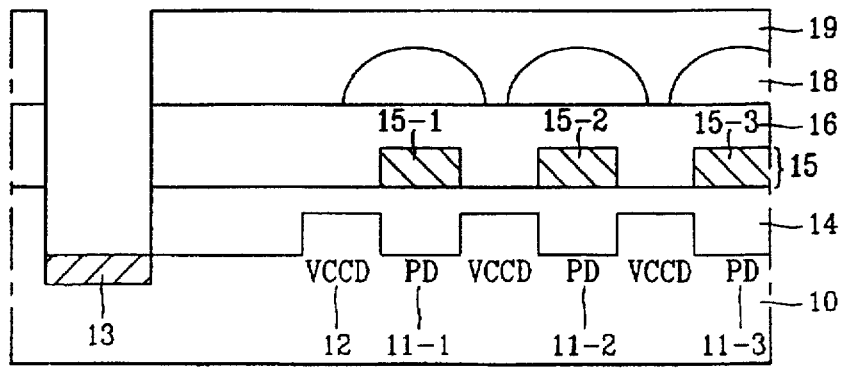
Figure 2:
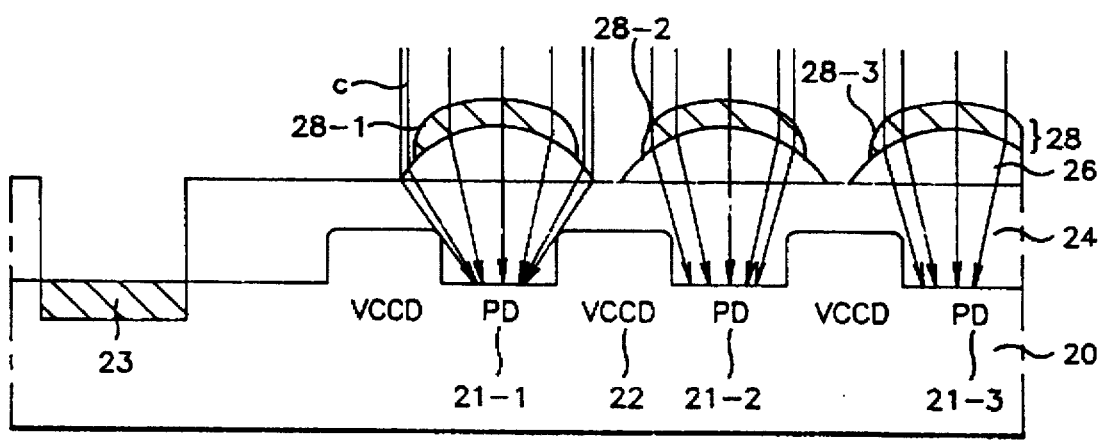
FIG. 2 is a cross-sectional view of a color charge-coupled device of the present invention.

FIG. 2 is a cross-sectional view of a color charge-coupled device according to the present invention.

Referring to FIG. 2, in the color charge-coupled device according to the present invention, a plurality of VCCDs 22 for transmitting charges are formed on a semiconductor substrate 20, being spaced apart by an equal distance. A plurality of photodiodes 21 for detecting light, corresponding to first to third colors, are formed on substrate 20 between VCCDs 22 so that photodiodes 21 and VCCDs 22 are alternately arranged. A pad 23 is formed on one side of semiconductor substrate 20 excluding photodiodes 21 and VCCDs 22. A planarizing film 24 is formed on substrate 20 excluding pad 23, and a plurality of microlenses 26 are formed on planarizing film 24 above each photodiode 21. A plurality of color filter layers 28 corresponding to the first to third colors are formed on each microlens 26 excluding its edge portion, respectively.

In the color charge-coupled device of the present invention having the aforementioned structure, color filer layers 28 corresponding to the first to third colors are formed on each microlens 26, in directly contact with the microlens. The edge portion each microlens is exposed so as to permeate white light C.

Each color filter layer has round edge portions. Further, among plurality of color filter layers 28, a first color filter layer 28-1 is formed on microlens 26 and corresponds to a photodiode 21-1 for first color. A second color filter layer 28-2 is formed on microlens 26 and corresponds to a photodiode 21-2 for second color. A third color filter layer 28-3 is formed on microlens 26 and corresponds to a photodiode 21-3 for third color.

FIGS. 3A to 3H are cross-sectional views for illustrating a method of manufacturing a color charge-coupled device according to one embodiment of the present invention.

In the embodiment of FIG. 3, there is provided a method of manufacturing a color charge-coupled device, wherein a thermal-flow process and hard-baking process are performed separately, thereby forming a color filter layer on a microlens.

Figure 3A:
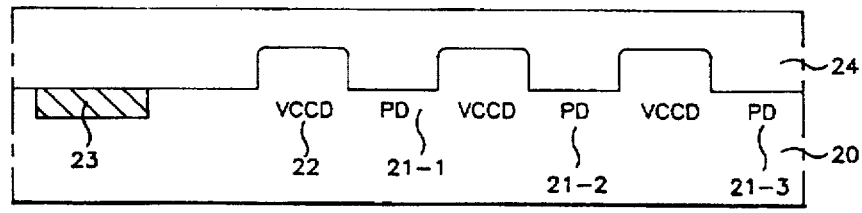
FIGS. 3A to 3H are cross-sectional views for illustrating a method of manufacturing a color charge-coupled device according to one embodiment of the present invention.

Referring to FIG. 3A, using a general process, a plurality of photodiodes 21 and a plurality of VCCDs 22 are alternately formed on a semiconductor substrate 20. A pad 23 is formed on one side of substrate 20 excluding a portion where the photodiodes and VCCDs are formed, thereby manufacturing a black/white charge-coupled device.

Among plurality of photodiodes 21 of FIG. 3A, reference numeral 21-1 represents a photodiode corresponding to a first color. Reference numeral 21-2 represents a photodiode corresponding to a second color. Reference numeral 21-3 represents a photodiode corresponding to a third color.

Thereafter, a planarizing film 24 is formed on the entire surface of the substrate wherein photodiodes 21, VCCDs 22, and pad 23 are formed.

Figure 3B:
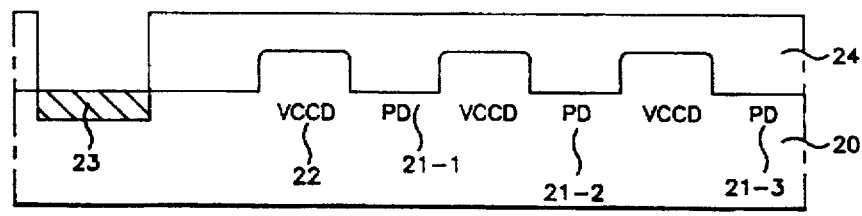

Referring to FIG. 3B, planarizing film 24 above pad 23 is removed by a photo-etching process, thereby exposing the upper surface of pad 23.

Figure 3C:
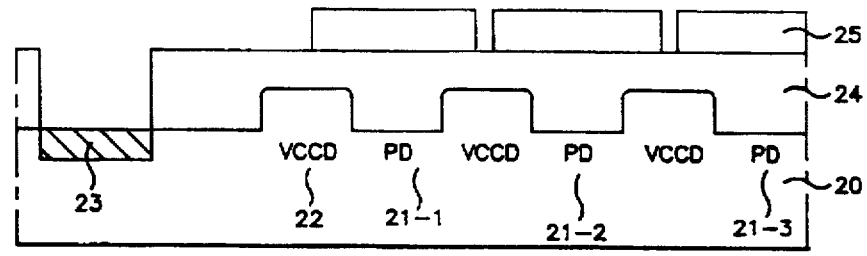

Referring to FIG. 3C, a material 25 for microlens is coated on planarizing film 24 including the upper surface of pad 23. Then, by performing a photo-etching process, material 25 for microlens is patterned so as to be left only on planarizing film 24 above respective photodiodes 21-1, 21-2 and 21-3.

Figure 3D:
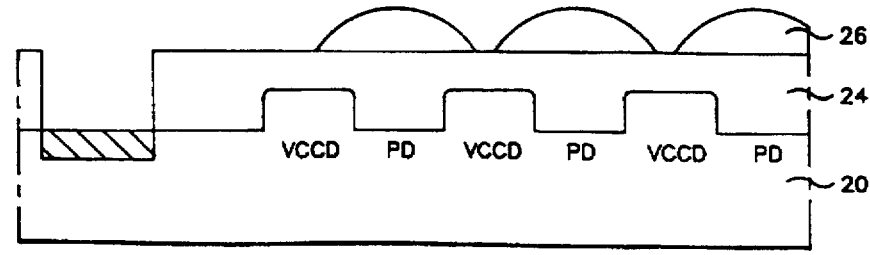

Thereafter, patterned material 25 for microlens is thermally flowed, thereby forming microlenses 26 on planarizing film 24 corresponding to each photodiode, as shown in FIG. 3D.

Figure 3E:
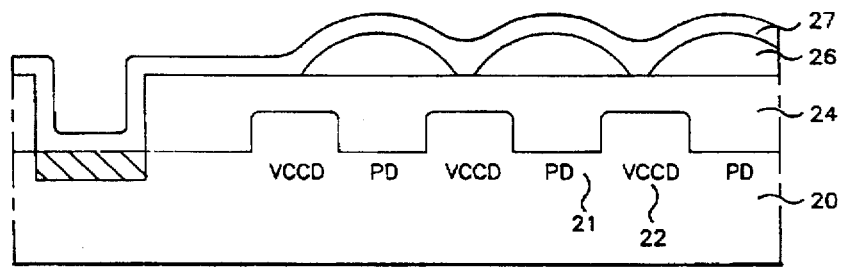

After forming microlenses 26, as shown in FIG. 3E, a first dyeing layer 27 is coated over the entire surface of the substrate. Then, according to a general dyeing process, first dyeing layer 27 is dyed and adhered with the first color.

Figure 3F:
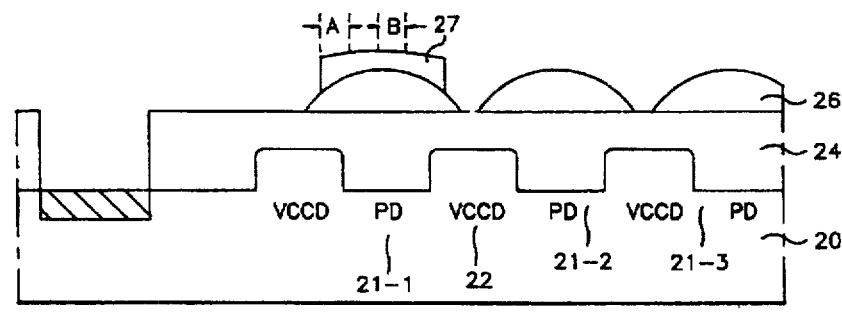

Then, after performing a dyeing process as shown in FIG. 3F, colored first dyeing layer 27 is patterned. Here, among plurality of photodiodes 21, the first dyeing layer is left only on microlens 26 located above photodiode 21-1 corresponding to the first color, and the other first dyeing layer all is removed.

At this time, as shown in FIG. 3F, first dyeing layer 26 left on photodiode 21-1 corresponding to the first color is formed so as not to surround the entire microlens 26, but to expose the edge portion of microlens 26.

Further, since first dyeing layer 27 is coated by a spin-coat method in FIG. 3E, first dyeing layer 27 is coated such that it becomes thicker in the valley portion between the microlenses rather than in the center portion of microlens 26. Accordingly, if first dyeing layer 27 is patterned, first dyeing layer 27 is formed such that it becomes thicker in the edge portion A rather than in the center portion B.

Figure 3G:
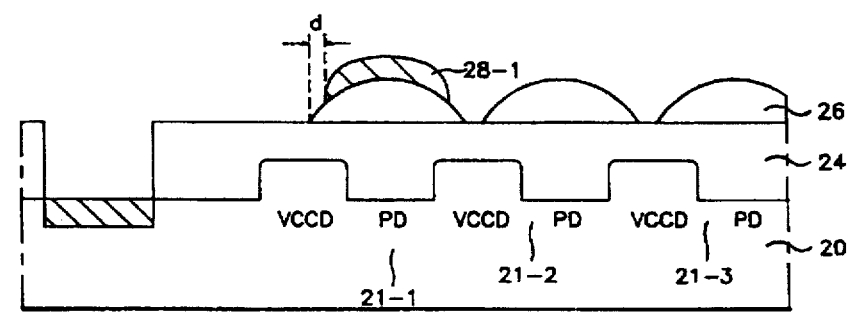

After patterning first dyeing layer 27, a hard-baking process is performed, thereby forming a first color filter layer 28-1 as shown in FIG. 3G.

When performing the hard-baking process, both thick edge portions of first dyeing layer 27 are flowed more, so that first color filter layer 28-1 is formed in a round shape so as to expose the edge portion of microlens 26 by a predetermined distance d.

Forming the first color filter layer in order to expose the edge portion of microlens 26 by a predetermined distance is done because white light must be permeated through the above portion.

Figure 3H:
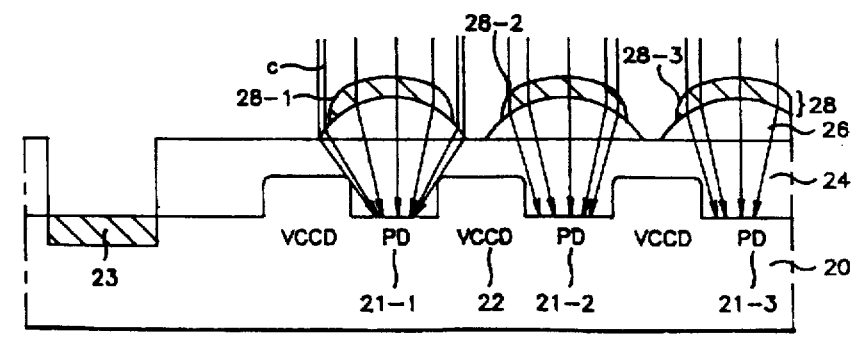

After forming first color filter layer 28-1, a second dyeing layer is coated over the entire surface of the substrate in the same method as that of forming first color filter layer 28-1. The second dyeing layer is dyed and adhered with the second color. Then, the second dyeing layer is patterned so as to be left only on photodiode 21-2 corresponding to the second color among plurality of photodiodes 21. Next, the patterned second dyeing layer is hard-baked, thereby forming a second color filter layer 28-2, as shown in FIG. 3H. Thereafter, according to the method as described above, a third color filter layer 28-3 is formed on microlens 26, thereby forming color filter 28. As a result, a color charge-coupled device is obtained according to the embodiment of the present invention.

In the above color charge-coupled device, it is possible to prevent color mixing since color filter layer 28 is directly formed on microlens 26. Further, since no color filter layer is formed on the edge portion of microlens 26, white light C is permeated through the edge portion of microlens 26 such that the sensitivity of color charge-coupled device can be improved.

FIGS. 4A to 4G are cross-sectional views for illustrating a method of manufacturing a color charge-coupled device according to another embodiment of the present invention.

In this embodiment of FIG. 4, there is provided a method of manufacturing a color charge-coupled device, wherein a thermal-flow process and hard-baking process are performed at the same time, thereby forming a color filter layer on a microlens.

Figure 4A:
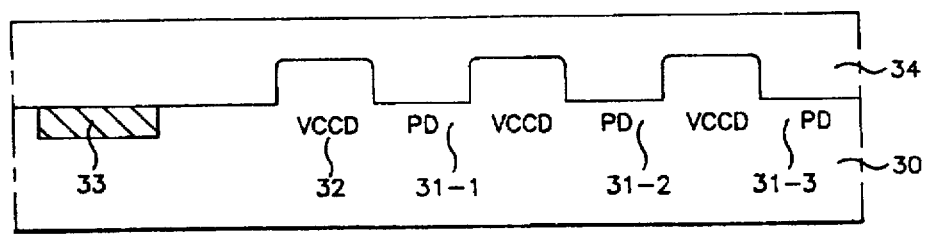
FIGS. 4A to 4G are cross-sectional views for illustrating a method of manufacturing a color charge-coupled device according to another embodiment of the present invention.

Referring to FIG. 4A, as in the above embodiment, a plurality of photodiodes 31 and a plurality of VCCDs 32 are formed by turns on a semiconductor substrate 30. A pad 33 is formed on one side of substrate 30, and then, a planarizing film 34 is formed over the entire surface of the substrate. Photodiodes 31 are comprised of a photodiode 31-1 corresponding to a first color, a photodiode 31-2 corresponding to a second color, and a photodiode 31-3 corresponding to a third color.

Figure 4B:
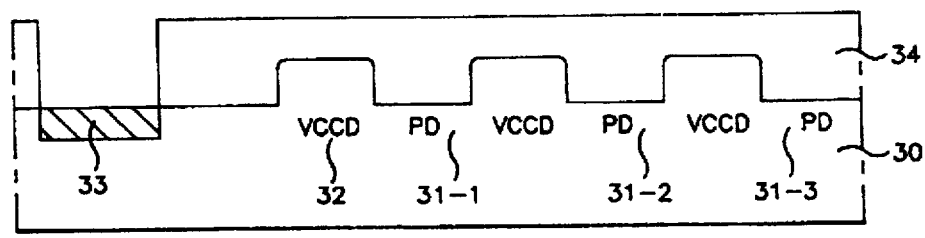

As shown in FIG. 4B, planarizing film 34 above pad 33 is removed by a photo-etching process, thereby exposing the upper surface of pad 33.

Figure 4C:
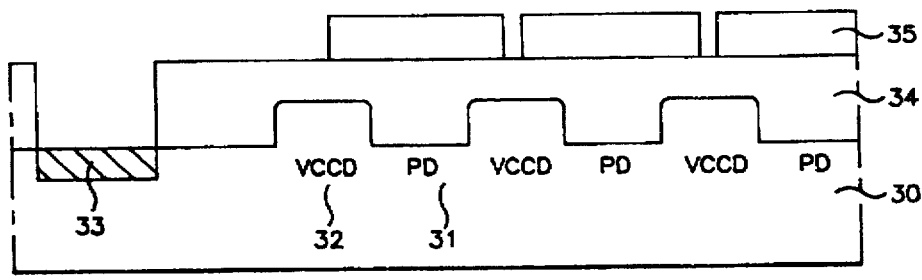

As shown in FIG. 4C, a material 35 for microlens is coated on planarizing film 34 including the upper surface of pad 33. Then, by performing a photo-etching process, material 35 for microlens is patterned so as to be left only on planarizing film 34 above each photodiode 31.

Figure 4D:
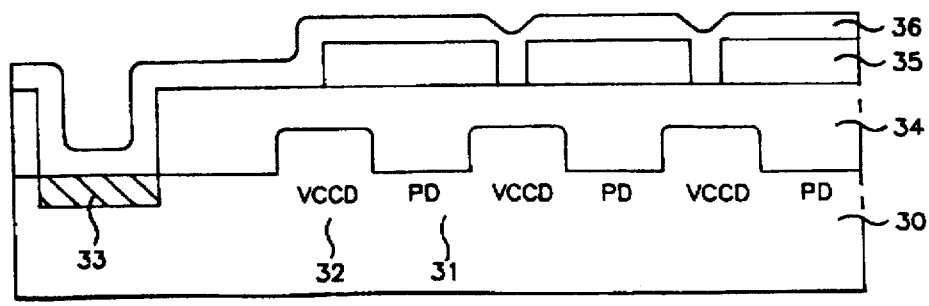

As shown in FIG. 4D, a first dyeing layer 36 is coated on substrate 30 including material 35 for microlens. Then, according to a general dyeing process, first dyeing layer 36 is dyed and adhered with the first color.

Figure 4E:
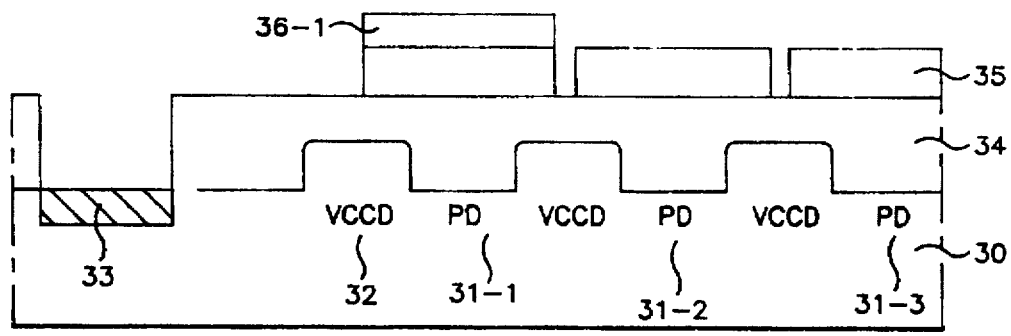

After performing the dyeing process as shown in FIG. 4E, colored first dyeing layer 36 is patterned by performing a photo etching process, thereby leaving first dyeing layer 36-1 only on photodiode 31-1 corresponding to the first color among a plurality of photodiodes 31.

Figure 4F:
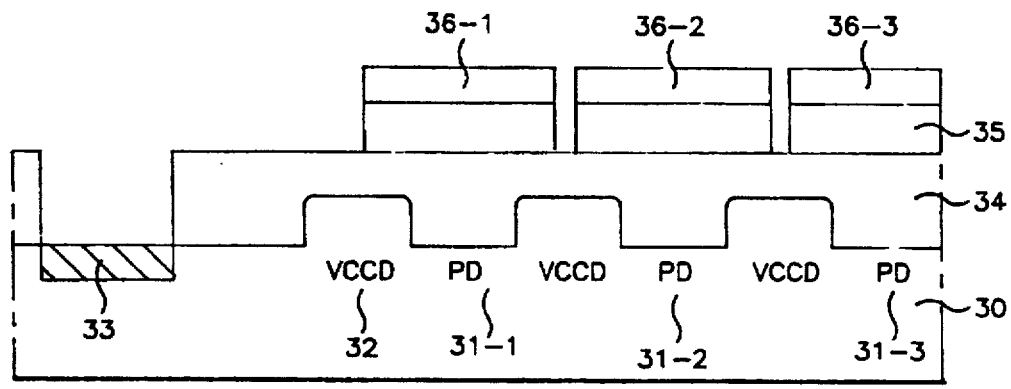

By performing the processes of FIGS. 4D and 4E, as shown in FIG. 4F, second and third dyeing layers 36-2 and 36-3 are formed on planarizing film 34 over photodiodes 31-2 and 31-3 corresponding to the second and third colors among a plurality of photodiodes 31, respectively. That is, after coating a second dyeing layer on the entire surface of the substrate, the coated second dyeing layer is dyed and adhered. Then, second dyeing layer 36-2 is patterned so as to be left only on photodiode 31-2 corresponding to the second color.

Then, after coating a third dyeing layer on the entire surface of the substrate, the coated third dyeing layer is dyed and adhered with the third color. Next, the third dyeing layer colored with the third color is patterned, thereby forming third dyeing layer 36-3 only on photodiode 31-3 corresponding to the third color.

After forming the dyeing layer, material 35 for microlens and first to third dyeing layers 36-1, 36-2 and 36-3 formed thereon are thermally flowed at the same time. Then, they are hard-baked, simultaneously.

Accordingly, material 35 for microlens is flowed, thereby forming microlenses 37 on planarizing film 34 corresponding to photodiodes 31. First to third color filter layers 38-1, 38-2 and 38-3 are formed on microlenses 37. As a result, color filter 38 is formed on microlens 37, thereby obtaining a color charge-coupled device according to the second embodiment.

Figure 4G:
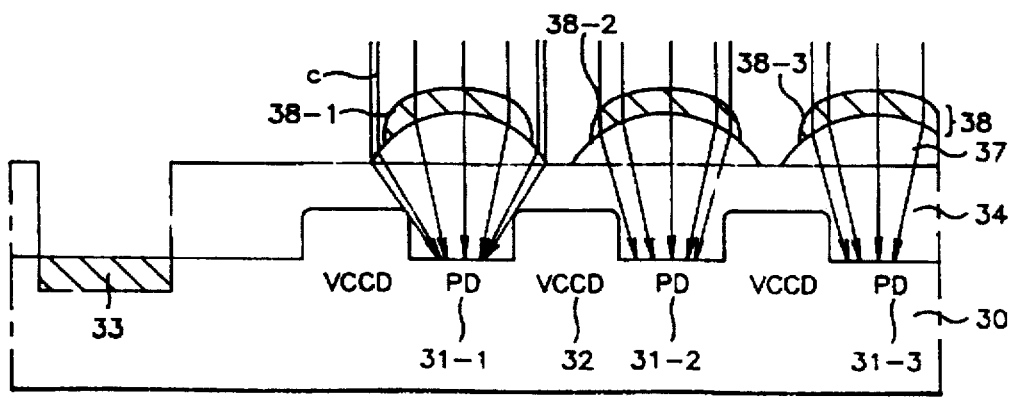

Referring to FIG. 4G, color filter layers 38-1, 38-2 and 38-3 are directly formed on microlenses 37 so as to expose the edge portion of microlens 37 by a predetermined distance d.

In the case that the microlens material 35 and dyeing layer 36 are thermally flowed at the same time, each color filter layer is formed so as to expose the edge portion of microlens 37, as in the above embodiment. The reason for doing it is that the degree of thermal-flowing of each dyeing layer 36 is lower than that of thermal-flowing of material 35 for microlens.

In the above two embodiments, for forming the color filter layer, the dyeing layer is coated, and the coated dyeing layer is dyed and adhered with the corresponding color. However, in the case that color layers containing the first to third colors are used, since the colors are contained within the color layers themselves, the color filter layers can be formed by performing only photo-etching process, without performing a dyeing and adhering process.

According to the present invention as describe above, the following effects can be obtained.

First, after forming microlenses, color filter layers are formed thereon, thereby preventing color mixing between neighboring color filter layers. Further, the color filter layers are formed on the microlenses so as to expose the edge portion of the microlenses, so that white light is permeated through the exposed microlense. Thus, the sensitivity of color charge-coupled device can be improved.

Secondly, a pad is exposed at the beginning of process, so that an etching process of exposing the pad and a process of removing remaining photoresist are omitted at the end of process. This prevents the generation of particles and prevents a device from being damaged due to the generation of particles. Further, the pad is exposed through one photo-etching process using a single planarizing film, so that the conventional complicated process of exposing the pad is omitted. This simplifies the process.

What is claimed is:

1. A method of manufacturing a color charge-coupled device, comprising the steps of:
    forming a plurality of light detectors corresponding to first, second and third colors and a plurality of charge transmission regions in alternate locations on a semiconductor substrate;
    forming a pad on one side of said substrate where no said light detectors and no said charge transmission regions are formed;
    forming a planarizing film on said substrate, said light detectors, said charge transmission regions, and said pad;
    removing said planarizing film from said pad;
    coating a microlens material on said planarizing film and patterning said microlens material so as to be left only on said planarizing film above said light detectors;
    thermally flowing said microlens material to thereby form microlenses on said planarizing film above said light detectors; and
    performing a hard-baking process to thereby form said first, second and third color filter layers directly on said microlenses corresponding to said light detectors of said first to third colors.

2. A method of manufacturing a color charge-coupled device as claimed in claim 1, wherein said step of performing said hard-baking process includes:
    restricting the size of said first, second and third color filter layers on said microlenses to expose annular edge portions of said microlenses between said color filter layers and said planarizing film so that white light is permeated through said annular edge portions of said microlenses.

3. A method of manufacturing a color charge-coupled device as claimed in claim 1, wherein said step of performing said hard-baking process includes the steps of:
    coating a first dyeing layer on said planarizing film and said microlenses;
    dyeing and adhering said first dyeing layer with said first color;
    patterning said first dyeing layer so as to be left only on said planarizing film above said light detector corresponding to said first color;
    performing a first hard-baking step of said hard-baking process on said first dyeing layer to thereby form said first color filter layer on said planarizing film above said light detector corresponding to said first color;
    coating a second dyeing layer on said planarizing film, said microlenses, and said first color filter layer;
    dyeing and adhering said second dyeing layer with said second color;
    patterning said second dyeing layer so as to be left only on said planarizing film above said light detector corresponding to said second color; and
    performing a second hard-baking step of said hard-baking process on said second dyeing layer to thereby form said second color filter layer on said planarizing film above said light detector corresponding to said first color;
    coating a third dyeing layer on said planarizing film, said microlenses, said first color filter layer, and said second color filter layer;
    dyeing and adhering said third dyeing layer with said third color;
    patterning said third dyeing layer so as to be left only on said planarizing film above said light detector corresponding to said third color; and
    performing a third hard-baking step of said hard-baking process on said third dyeing layer to thereby form said third color filter layer on said planarizing film above said light detector corresponding to said third color.

4. A method of manufacturing a color charge-coupled device is claimed in claim 1, wherein said step of performing said hard-baking process includes the steps of:
    coating said first color layer having said first color on said planarizing and said microlenses;
    patterning said first color layer so as to be left only on said planarizing film above said light detector corresponding to said first color;
    performing a first hard-baking step of said hard-baking process on said first color layer to thereby form said first color filter layer on said planarizing film above said light detector corresponding to said first color;
    coating said second color layer having said second color on said planarizing film, said microlenses, and said first color filter layer;
    patterning said second color layer so as to be left only on said planarizing film above said light detector corresponding to said second color;
    performing a second hard-baking step of said hard baking process on said second color layer to thereby form said second color filter layer on said planarizing film above said light detector corresponding to said second color;
    coating said third color layer having said third color on said planarizing film, said microlenses, said first color filter layer, and said second color filter layer;
    patterning said third color layer so as to be left only on said planarizing film above said light detector corresponding to said third color; and
    performing a third hard-baking step of said hard-baking process on said third color layer to thereby form said third color filter layer on said planarizing film above said light detector corresponding to said third color.

5. A method of manufacturing a color charge-coupled device, comprising the steps of:
    forming a plurality of light detectors corresponding to first, second and third colors and a plurality of charge transmission regions in alternate locations on a semiconductor substrate;
    forming a pad on one side of said substrate where no said light detectors and no said charge transmission regions are formed;
    forming a planarizing film on said substrate excluding said pad; and
    performing a thermal-flow process to thereby form said microlenses on said planarizing film;
    performing a hard-baking process to thereby form said first, second and third color filter layers on said microlenses, respectively.

6. A method of manufacturing a color charge-coupled device as claimed in claim 5, wherein said step of performing said hard-baking process includes:
    restricting the size of said first, second and third color filter layers on said microlenses to exclude annular edge portions of said microlenses between said color filters and said planarizing film so that white light is permeated through said edge portions of said microlenses.

7. A method of manufacturing a color charge-coupled device as claimed in claim 5, wherein said step of performing said thermal-flow process includes:

coating a microlens material on said planarizing film, and patterning said microlens material to thereby leave said microlens material on said planarizing film corresponding to each of said light detectors;

wherein said step of performing said hard-baking process includes:

coating a first dyeable layer on said microlens-material and said planarizing film;

dying and adhering said first dyeable layer with said first color to form said first color filter layer;

patterning said first color-filter layer so as to be left only on said microlens material above said light detectors corresponding to said first color;

coating a second dyeable layer on said planarizing film;

dyeing and adhering said second dyeing layer with said second color to form said second color filter layer;

patterning said second color filter layer so as to be left only on said microlens material above said light detectors corresponding to said second color;

coating a third dyeable layer on said planarizing film;

dyeing and adhering said third dyeable layer with said third color to form said third color filter layer;

patterning said third color filter layer so as to be left only on said microlens material above said light detectors corresponding to said third color; and wherein said step of performing said thermal-flow process also includes a step of thermally flowing said microlens material and said step of performing said hard-baking process also includes a step, performed simultaneously with said step of thermally flowing, of hard-baking said first, second and third color filter layers to thereby form microlenses and first, second, and third color filter layers, respectively.

8. A method of manufacturing a color charge-coupled device as claimed in claim 5, wherein said step of performing said thermal-flow process includes:

coating a microlens material on said planarizing film, and patterning said microlens material, to thereby leave said microlens material on said planarizing film corresponding to each of said light detectors;

wherein said step of performing said hard-baking process includes:

coating said first color layer having said first color on said planarizing film;

patterning said first color layer so as to be left only on said microlens material above said light detectors corresponding to said first color;

coating said second color layer having said second color on said planarizing film;

patterning said second color layer so as to be left only on said microlens material above said light detectors corresponding to said second color;

coating said third color layer having said third color on said planarizing film;

patterning said third color layer so as to be left only on said material for microlens above said light detectors corresponding to said third color; and wherein said step of performing said thermal-flow process also includes a step of thermally flowing said microlens material and said step of performing said hard-baking process also includes a step, performed simultaneously with said step of thermally flowing, of hard-baking said first, second and third color layers to thereby form said microlenses and first, second and third color filter layers, respectively.

9. A method of forming a charge-coupled device comprising the steps of:

providing a substrate having light detectors interspersed with charge transmission regions;

forming a planarizing film on said substrate;

forming microlenses on said planarizing film over said light detectors; and forming a color filter, corresponding to one of three colors, on each of said microlenses.

10. A method as in claim 9, wherein said step of forming a color filter includes:

restricting the size of said filters so that an annular edge portion of each of said microlenses, between said planarizing film and said filter, remains uncovered by said filter such that white light passes through said edge portion of said lens and mixes with colored light that has passed through said filter and then through said microlens.

11. A method as in claim 9, wherein:

said step of forming microlenses includes:

forming a layer of microlens material on said substrate;

removing portions of said layer of microlens material over said charge transfer regions; and thermally flowing said layer of microlens material to form said microlenses over said light detectors;

wherein said step of forming a color filter on each of said microlenses includes:

forming a layer of first-color-filtering material on said layer of microlens material over light detectors corresponding to a first color;

forming a layer of second-color-filtering material on said layer of microlens material over light detectors corresponding to a second color;

forming a layer of third-color-filtering material on said layer of microlens material over light detectors corresponding to a third color; and hard-baking said layers of first-color-filtering material, second-color-filtering material and third-color-filtering material to form first color filters, second color filters and third color filters, respectively.

12. A method as in claim 11, wherein said steps of thermally flowing and hard-baking are performed simultaneously.

13. A method as in claim 11, wherein:

said step of forming a layer of first-color-filtering material on said layer of micrcolens material over light detectors corresponding to a first color includes:

putting a first layer of dyeable material on said layer of microlens material and said planarizing film;

dyeing said first layer of dyeable material with a first color to form said layer of first-color-filtering material; and selectively removing portions of said layer of first-color-filtering material over said charge transfer regions and over light detectors corresponding to a second or a third color;

said step of forming a layer of second-color-filtering material on said layer of microlens material over light detectors corresponding to a second color includes:

putting a second layer of dyeable material on said layer of first-color-filtering material, said layer of microlens material and said planarizing film;

dyeing said second layer of dyeable material with said second color to form said layer of second-color-filtering material; and selectively removing portions of said layer of second-color-filtering material over said charge transfer regions and over light detectors corresponding to said first or third colors; and said step of forming a layer of third-color-filtering material on said layer of microlens material over light detectors corresponding to a third color includes:
putting a third layer of dyeable material on said layer of first-color-filtering material, said second-color-filtering material, said layer of microlens material and said planarizing film;
dyeing said third layer of dyeable material with said second color to form said layer of third-color-filtering material; and
selectively removing portions of said layer of third-color-filtering material over said charge transfer regions and over light detectors corresponding to said first or second colors.

14. A method as in claim 11, wherein:

said step of forming a layer of first-color-filtering material on said layer of microlens material over light detectors corresponding to a first color includes:
putting said layer of first-color-filtering material on said layer of microlens material and said planarizing film; and
selectively removing portions of said layer of first-color-filtering material over said charge transfer regions and over light detectors corresponding to a second or a third color;

said step of forming a layer of second-color-filtering material on said layer of microlens material over light detectors corresponding to a second color includes:
putting said layer of second-color-filtering material on said layer of first-color-filtering material, said layer of microlens material and said planarizing film; and
selectively removing portions of said layer of second-color-filtering material over said charge transfer regions and over light detectors corresponding to said first or third colors; and said step of forming a layer of third-color-filtering material on said layer of microlens material over light detectors corresponding to a third color includes:
putting said layer of third-color-filtering material on said layer of first-color-filtering material, said second-color-filtering material, said layer of microlens material and said planarizing film; and
selectively removing portions of said layer of third-color-filtering material over said charge transfer regions and over light detectors corresponding to said first or second colors.

* * * * *

UNITED STATES PATENT AND TRADEMARK OFFICE
CERTIFICATE OF CORRECTION

PATENT NO. : 5,677,200
DATED : October 14, 1997
INVENTOR(S) : C. H. PARK et al.

It is certified that error appears in the above-identified patent and that said Letters Patent is hereby corrected as shown below:

On the title page:

ITEM 73: Please change "LG Semicond Co., Ltd.," to --LG Semicon Co., Ltd.,--

Signed and Sealed this

Eighth Day of September, 1998

Attest:

BRUCE LEHMAN

Attesting Officer

Commissioner of Patents and Trademarks